US012627088B2

(12) United States Patent
Yamada et al.

(10) Patent No.: US 12,627,088 B2
(45) Date of Patent: May 12, 2026

(54) CONNECTOR-EQUIPPED FLEXIBLE PRINTED CIRCUIT BOARD

(71) Applicant: MEKTEC CORPORATION, Tokyo (JP)

(72) Inventors: Shuzo Yamada, Tokyo (JP); Tomoki Kanayama, Tokyo (JP); Tasuku Ono, Tokyo (JP)

(73) Assignee: MEKTEC CORPORATION, Tokyo (JP)

( * ) Notice: Subject to any disclaimer, the term of this patent is extended or adjusted under 35 U.S.C. 154(b) by 316 days.

(21) Appl. No.: 18/481,690

(22) Filed: Oct. 5, 2023

(65) Prior Publication Data

US 2024/0213698 A1 Jun. 27, 2024

(30) Foreign Application Priority Data

Dec. 27, 2022 (JP) ................................. 2022-209734

(51) Int. Cl.
*H01R 12/77* (2011.01)
*H01R 12/70* (2011.01)
*H05K 1/189* (2026.01)

(52) U.S. Cl.
CPC ......... *H01R 12/774* (2013.01); *H01R 12/707* (2013.01); *H01R 12/772* (2013.01); *H05K*

*1/189* (2013.01); *H05K 2201/10189* (2013.01); *H05K 2201/2009* (2013.01)

(58) Field of Classification Search
CPC ............................................. H01R 2/771–775
See application file for complete search history.

(56) References Cited

U.S. PATENT DOCUMENTS 11,799,224 B2* 10/2023 Kobayashi ........... H01R 13/424

FOREIGN PATENT DOCUMENTS

JP 2006-108387 A 4/2006

* cited by examiner

*Primary Examiner* — Ross N Gushi
(74) *Attorney, Agent, or Firm* — Studebaker Brackett PLLC

(57) ABSTRACT

A connector-equipped flexible printed circuit board includes: a flexible printed circuit board; a connector having a terminal to be connected to a line provided for the flexible printed circuit board and joined to the flexible printed circuit board; and a reinforcing plate fixed to a surface of the flexible printed circuit board opposite to a portion joined to the connector, in which the connector has a joint protrusion configured to penetrate the flexible printed circuit board, and a stopper structure that restricts movement of the connector in a direction apart from the flexible printed circuit board is provided in addition to joint between the line and the terminal and the joint protrusion.

5 Claims, 17 Drawing Sheets

CONNECTOR-EQUIPPED FLEXIBLE PRINTED CIRCUIT BOARD

CROSS-REFERENCES

This application claims priority from Japanese Patent Application No. 2022-209734 filed with the Japan Patent Office on Dec. 27, 2022, the entire content of which is hereby incorporated by reference.

BACKGROUND

1. Technical Field

One aspect of the present disclosure relates to a connector-equipped flexible printed circuit board.

2. Related Art

For electric connection components included in various devices, one using a wire harness has been replaced with one using a flexible printed circuit board (hereinafter referred to as an "FPC"). Such a component is provided with a connector for electric connection. As compared to joint strength between a line and a connector in the former component, joint strength between an FPC and a connector in the latter component tends to be lower. Particularly, in the case of application for vehicle installation, vibration and impact act on a portion of the FPC joined to the connector not only upon assembly but also upon vehicle use, and for this reason, there has been a demand for a higher joint strength. For example, in the case of a connector of about 30 poles, a joint strength of about 50 N is required.

A connector-equipped flexible printed circuit board (hereinafter referred to as a "connector-equipped FPC 500") according to the prior art will be described with reference to FIGS. 17, 18A, and 18B. FIGS. 17, 18A, and 18B are schematic views of the configuration of the connector-equipped FPC 500 according to the prior art. Note that FIG. 17 is a plan view showing the vicinity of a connector of the connector-equipped FPC 500. FIG. 18A is a side view showing the vicinity of the connector of the connector-equipped FPC 500. FIG. 18B is a sectional view along a DD line of FIG. 17.

The connector-equipped FPC 500 includes an FPC 510, a connector 520 joined to the FPC 510, and a reinforcing plate 530. The reinforcing plate 530 is fixed to the surface of the FPC 510 opposite to the portion joined to the connector 520.

The FPC 510 includes a plurality of lines 511 formed by etching of metal foil (e.g., copper foil) and resin films 512 covering both surfaces of the lines 511. Note that in FIG. 17, the lines 511 are shown in a see-through state and are indicated by dashed lines. The connector 520 includes a housing 521 and a plurality of terminals 522 each connected to the plurality of lines 511. The plurality of lines 511 and the plurality of terminals 522 are joined to each other by soldering, and accordingly, the connector 520 is joined to the FPC 510. However, joint force between the FPC 510 and the connector 520 is weak only by joint between the plurality of lines 511 and the plurality of terminals 522. For this reason, the reinforcing plate 530 is provided, and a plurality of joint protrusions 523 configured to penetrate the FPC 510 is provided at the connector 520. These joint protrusions 523 are provided integrally with protrusion holding portions 521a of the housing 521. These joint protrusions 523 are configured to penetrate the FPC 510 and fit in a plurality of through-holes 531 provided in the reinforcing plate 530 when the connector 520 is arranged (joined) on the FPC 510. Moreover, the joint force is enhanced by flow soldering for the periphery of the through-holes, through which the joint protrusions 523 penetrate, of the FPC 510. The above-described configuration is employed so that the joint force between the FPC 510 and the connector 520 can be enhanced.

However, there has been a demand for further reduction in damage of the FPC 510 when the connector-equipped FPC 500 receives vibration or impact.

Note that the prior art documents of this field include, for example, JP-A-2006-108387.

SUMMARY

A connector-equipped flexible printed circuit board includes: a flexible printed circuit board; a connector having a terminal to be connected to a line provided for the flexible printed circuit board and joined to the flexible printed circuit board; and a reinforcing plate fixed to a surface of the flexible printed circuit board opposite to a portion joined to the connector, in which the connector has a joint protrusion configured to penetrate the flexible printed circuit board, and a stopper structure that restricts movement of the connector in a direction apart from the flexible printed circuit board is provided in addition to joint between the line and the terminal and the joint protrusion.

BRIEF DESCRIPTION OF DRAWINGS

FIG. 7 is a schematic view of the configuration of the connector-equipped flexible printed circuit board according to the second embodiment of the present disclosure;

FIG. 13 is a schematic view of the configuration of the connector-equipped flexible printed circuit board according to the fourth embodiment of the present disclosure;

FIG. 14 is a schematic sectional view of a reinforcing support member according to the fourth embodiment of the present disclosure;

Figure 1A:
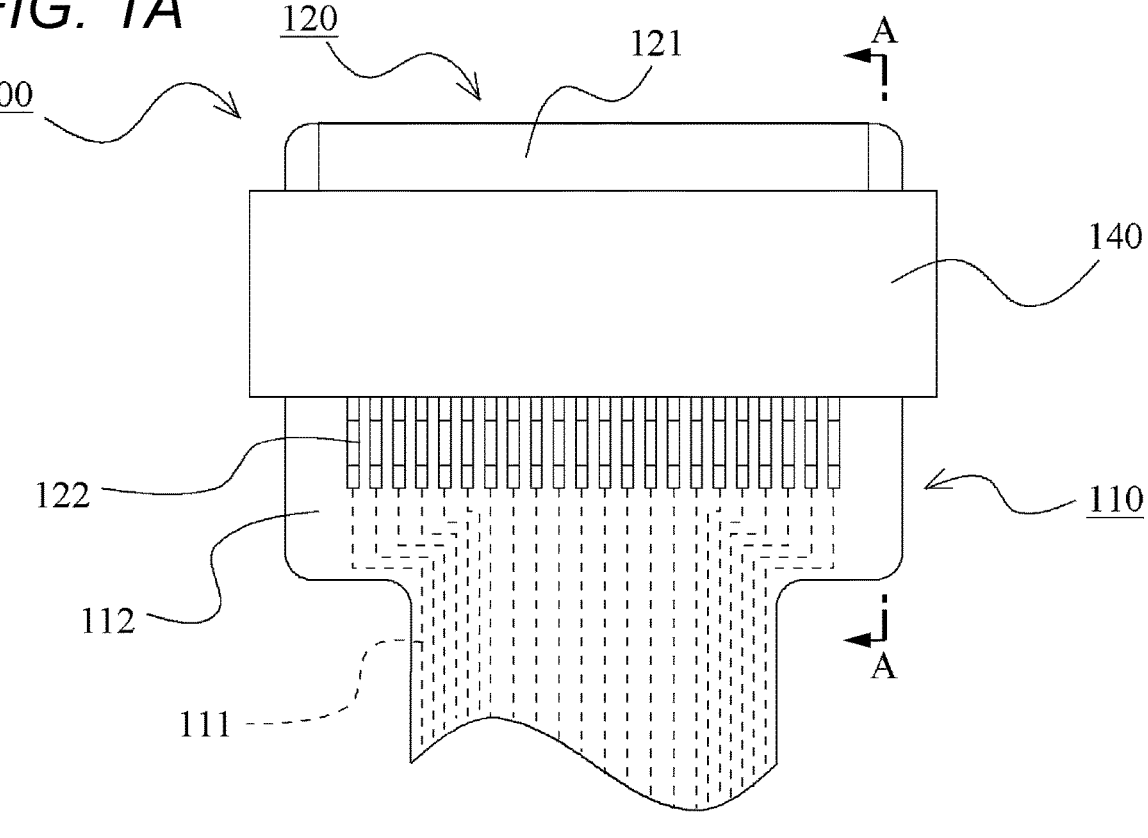
FIGS. 1A and 1B are schematic views of the configuration of a connector-equipped flexible printed circuit board according to a first embodiment of the present disclosure.

One object of the present disclosure is to provide a connector-equipped flexible printed circuit board configured so that damage of the vicinity of a portion of a flexible printed circuit board joined to a connector can be reduced.

DETAILED DESCRIPTION

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A connector-equipped flexible printed circuit board according to an aspect of the present disclosure includes: a flexible printed circuit board; a connector having a terminal to be connected to a line provided for the flexible printed circuit board and joined to the flexible printed circuit board; and a reinforcing plate fixed to a surface of the flexible printed circuit board opposite to a portion joined to the connector, in which the connector has a joint protrusion configured to penetrate the flexible printed circuit board, and a stopper structure that restricts movement of the connector in a direction apart from the flexible printed circuit board is provided in addition to joint between the line and the terminal and the joint protrusion.

According to the above-described aspect of the present disclosure, the stopper structure is provided so that separation of the connector from the flexible printed circuit board can be reduced even when vibration or impact acts.

The stopper structure may include a support member, and the support member may have a support plate portion contacting a surface of the connector opposite to a surface joined to the flexible printed circuit board, a pair of side plate portions extending from both sides of the support plate portion toward the reinforcing plate, and engagement portions each provided at tip ends of the pair of side plate portions to engage with the reinforcing plate.

The support member configured as described above is provided so that separation of the connector from the flexible printed circuit board can be reduced.

The support member may include a cover that covers the terminal and an exposed portion of the line on the flexible printed circuit board.

With this configuration, a probability of, e.g., a hand or a finger accidentally contacting the terminal or the line can be reduced, and a probability of water droplets adhering to the terminal or the line and causing short-circuit can be reduced.

The stopper structure may include a pair of side plate portions extending along side wall surfaces of the connector, and engagement portions each provided at tip ends of the pair of side plate portions to engage with the side wall surfaces of the connector, and the pair of side plate portions and the engagement portions may be included in the reinforcing plate.

Such a reinforcing plate is employed so that separation of the connector from the flexible printed circuit board can also be reduced.

The stopper structure may include a reinforcing support member, and the reinforcing support member may have a support plate portion contacting a surface of the connector opposite to a surface joined to the flexible printed circuit board, a pair of reinforcing side plate portions extending from both sides of the support plate portion along the pair of side plate portions of the reinforcing plate, and reinforcing engagement portions each provided at tip ends of the pair of reinforcing side plate portions to engage with the pair of side plate portions.

With this configuration, separation of the connector from the flexible printed circuit board can be further reduced.

The reinforcing support member may include a cover that covers the terminal and an exposed portion of the line on the flexible printed circuit board.

With this configuration, a probability of, e.g., a hand or a finger accidentally contacting the terminal or the line can be reduced, and a probability of water droplets adhering to the terminal or the line and causing short-circuit can be reduced.

Note that the above-described configurations may be employed in combination to the extent possible.

As described above, according to one aspect of the present disclosure, damage of the vicinity of the portion of the flexible printed circuit board joined to the connector can be reduced.

Hereinafter, an exemplary embodiment of the present disclosure will be described in detail based on an example with reference to the drawings. Note that unless otherwise specified, the technical scope of the present disclosure is not limited to the dimensions, materials, shapes, relative arrangements, and the like of components described in the embodiment.

First Embodiment

Figure 1B:
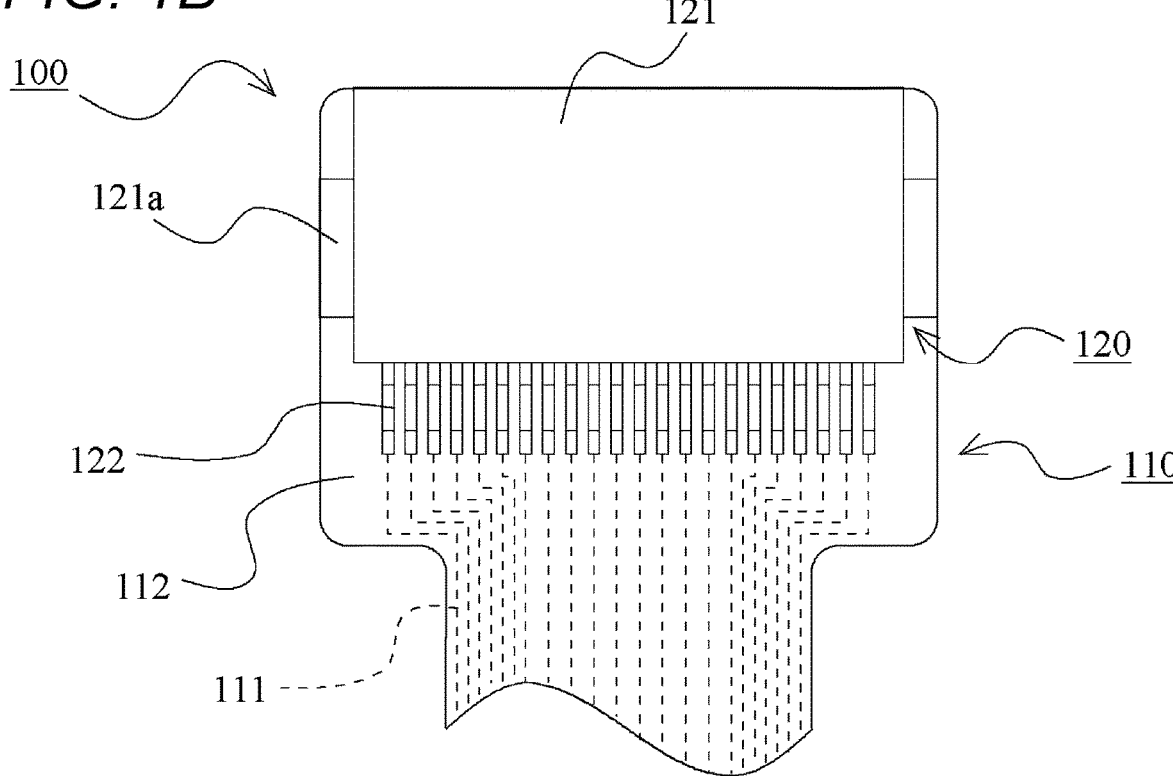
Figure 2A:
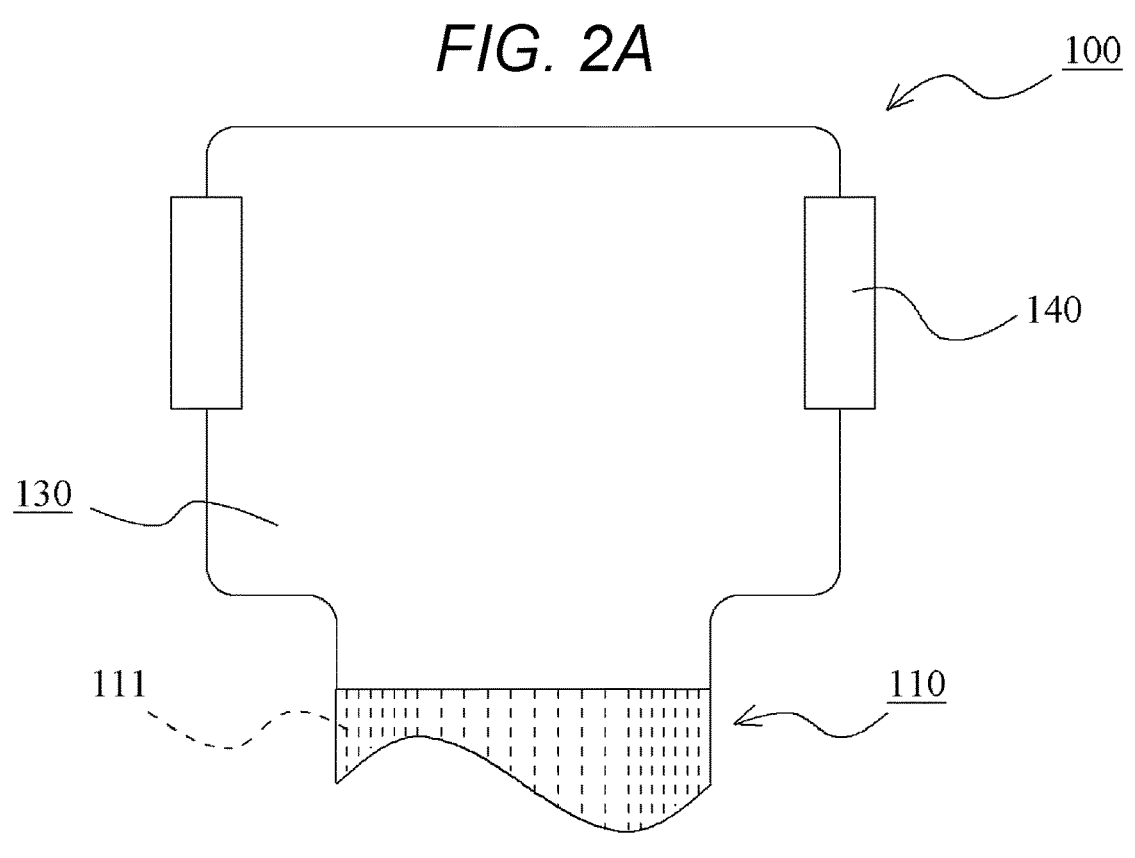
FIGS. 2A and 2B are schematic views of the configuration of the connector-equipped flexible printed circuit board according to the first embodiment of the present disclosure.
Figure 2B:
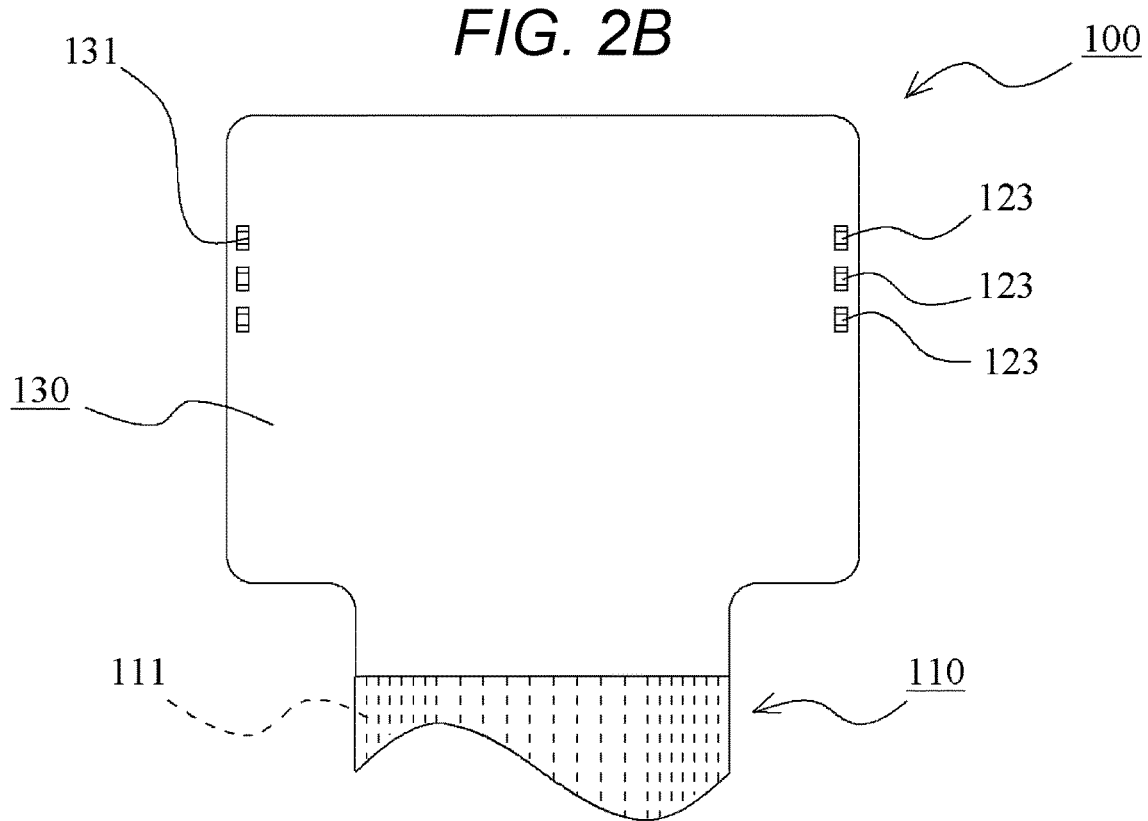
Figures 3A, 3B:
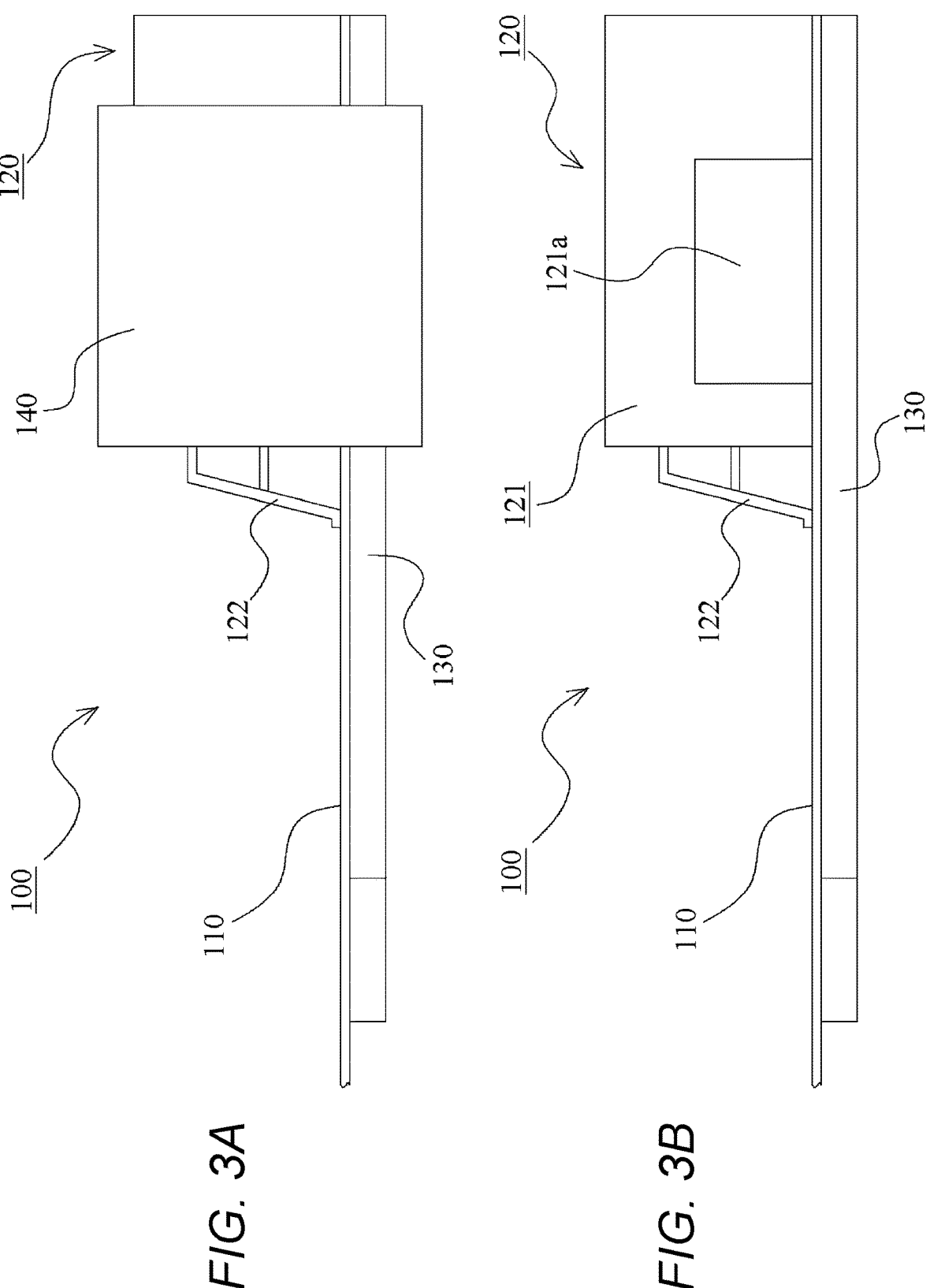
FIGS. 3A and 3B are schematic views of the configuration of the connector-equipped flexible printed circuit board according to the first embodiment of the present disclosure.
Figure 4:
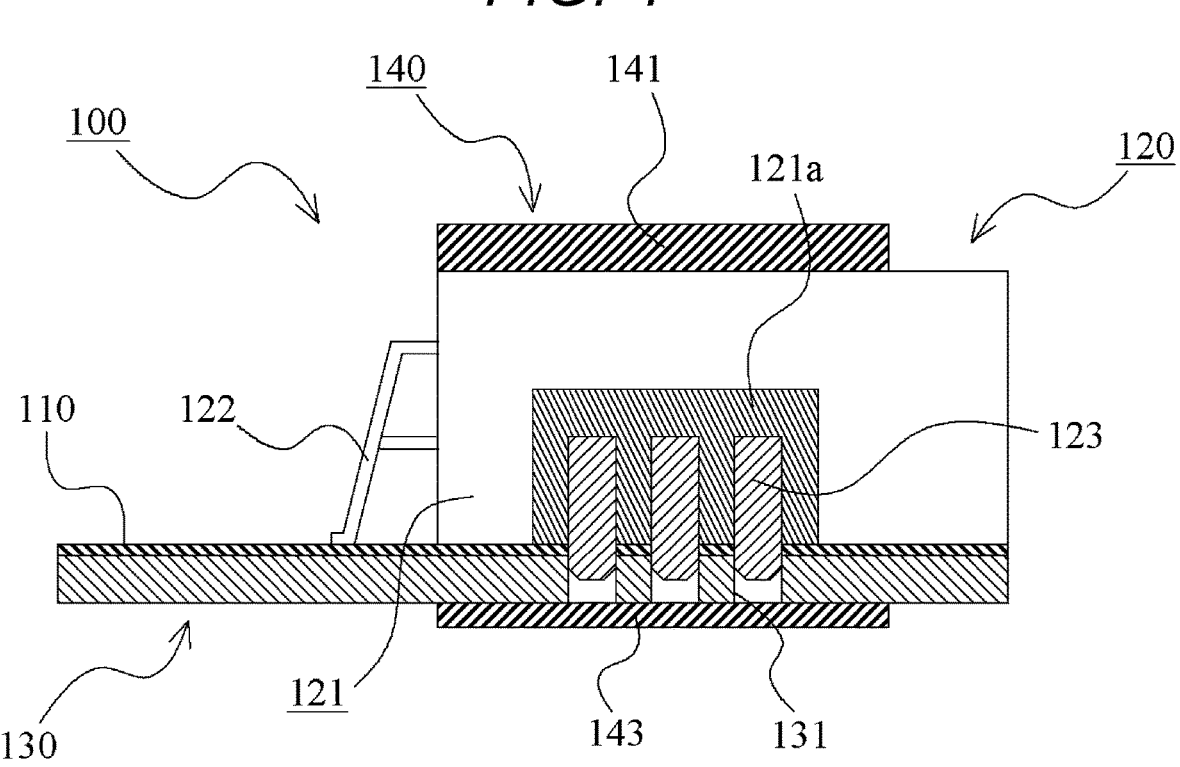
FIG. 4 is a schematic view of the configuration of the connector-equipped flexible printed circuit board according to the first embodiment of the present disclosure.
Figure 5:
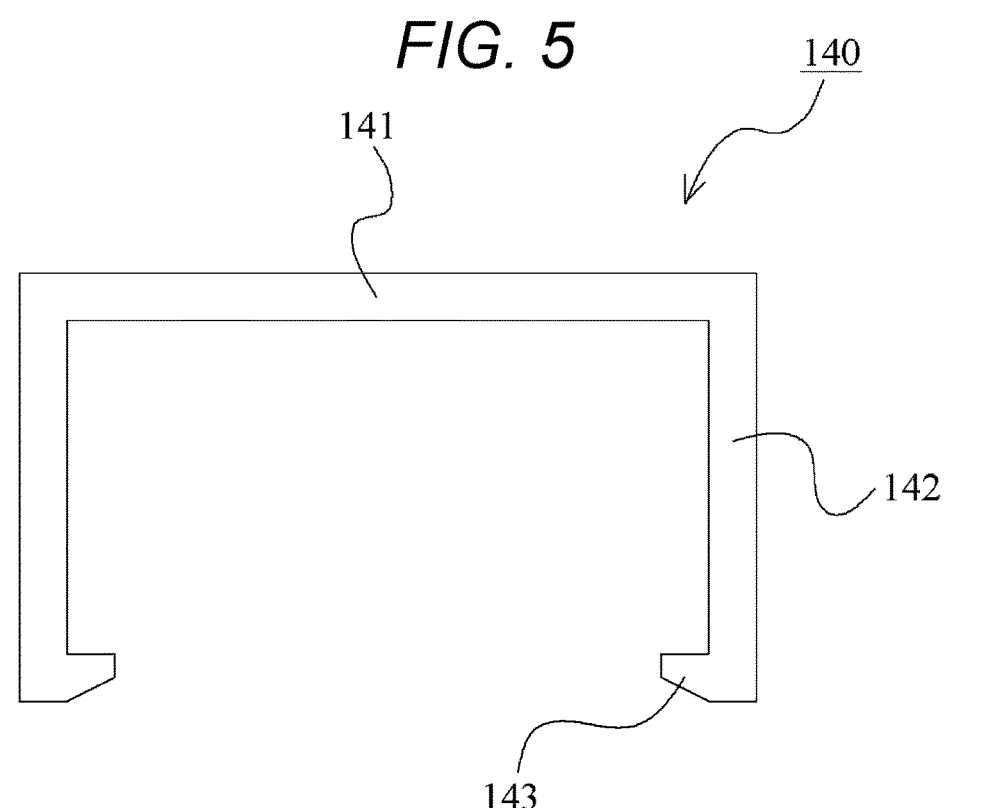
FIG. 5 is a front view of a support member according to the first embodiment of the present disclosure.

A connector-equipped flexible printed circuit board 100 (hereinafter referred to as a connector-equipped FPC 100) according to a first embodiment of the present disclosure will be described with reference to FIGS. 1A to 5. FIGS. 1A to 4 are schematic views of the configuration of the connector-equipped FPC 100 according to the first embodiment of the present disclosure. Note that FIG. 1A is a plan view showing the vicinity of a connector of the connector-equipped FPC 100. FIG. 1B is a view showing a state of a support member being detached from the connector-equipped FPC 100 shown in FIG. 1A. FIG. 2A is a back view showing the vicinity of the connector of the connector-equipped FPC 100. FIG. 2B is a view showing a state of the support member being detached from the connector-equipped FPC 100 shown in FIG. 2A. FIG. 3A is a side view showing the vicinity of the connector of the connector-equipped FPC 100. FIG. 3B is a view showing a state of the support member being detached from the connector-equipped FPC 100 shown in FIG. 3A. FIG. 4 is a sectional view along an AA line of FIG. 1A. FIG. 5 is a front view of the support member according to the first embodiment of the present disclosure.

The connector-equipped FPC 100 includes a flexible printed circuit board 110 (hereinafter referred to as an FPC 110), a connector 120 joined to the FPC 110, and a reinforcing plate 130. The reinforcing plate 130 is fixed to the surface of the FPC 110 opposite to the portion joined to the connector 120. The reinforcing plate 130 is mainly formed of a thick high-stiffness member such as a polyimide film, a plate of metal such as aluminum or stainless steel, or a glass epoxy plate.

The FPC 110 includes a plurality of lines 111 formed by etching of metal foil (e.g., copper foil) and resin films 112 covering both sides of the lines 111. Note that in FIGS. 1A, 1B, 2A, and 2B, the lines 111 are shown in a see-through state and are indicated by dashed lines. The connector 120 includes a housing 121 and a plurality of terminals 122 each connected to the plurality of lines 111.

As described in the prior art, joint force between the FPC 110 and the connector 120 is weak only by joint between the plurality of lines 111 and the plurality of terminals 122. For this reason, in the present embodiment, the reinforcing plate 130 is provided, and the connector 120 is provided with a plurality of metal joint protrusions 123 configured to penetrate the FPC 110. As shown in FIG. 4, the plurality of joint protrusions 123 is provided integrally with protrusion holding portions 121_a_ of the housing 121. For example, the resin housing 121 may be molded, by insert molding, with the plurality of terminals 122 and the plurality of joint protrusions 123 as insert components, and in this manner, the connector 120 may be obtained. The plurality of joint protrusions 123 is configured to penetrate the FPC 110 when the connector 120 is arranged (joined) on the FPC 110. Moreover, the joint force is enhanced by flow soldering for the periphery of through-holes, through which the joint protrusions 123 penetrate, of the FPC 110. The above-described configuration is employed so that the joint force between the FPC 110 and the connector 120 can be enhanced.

In the present embodiment, a stopper structure that restricts movement of the connector 120 in a direction apart from the FPC 110 is provided in addition to joint between the lines 111 and the terminals 122 and the joint protrusions 123.

The stopper structure according to the present embodiment mainly includes a support member 140 made of a material such as resin or metal. The support member 140 includes a support plate portion 141, a pair of side plate portions 142 provided on both sides of the support plate portion 141, and engagement claws 143 which are engagement portions each provided at the tip ends of the pair of side plate portions 142. The support plate portion 141 is configured to contact the surface of the connector 120 (more specifically the housing 121 of the connector 120) opposite to the surface joined to the FPC 110. The pair of side plate portions 142 is configured to extend from both sides of the support plate portion 141 toward the reinforcing plate 130. Moreover, the pair of engagement claws 143 is configured to engage with the reinforcing plate 130.

<Advantages of Connector-Equipped FPC 100 according to Present Embodiment>

The connector-equipped FPC 100 according to the present embodiment employs the configuration including the support member 140 configured as described above. With this configuration, separation of the connector 120 from the FPC 110 can be reduced. Since the connector-equipped FPC 100 includes the stopper structure as described above, separation of the connector 120 from the FPC 110 can be reduced even when vibration or impact acts on the connector-equipped FPC 100. Thus, damage of the vicinity of the portion of the FPC 110 joined to the connector 120 can be reduced.

Second Embodiment

FIGS. 6A to 8 show a second embodiment of the present disclosure. The present embodiment describes a configuration different from the first embodiment in a stopper structure. Other configurations and features are the same as those of the first embodiment. Thus, the same reference numerals are used to represent the same components, and description thereof will be omitted as necessary.

Figures 6A, 6B:
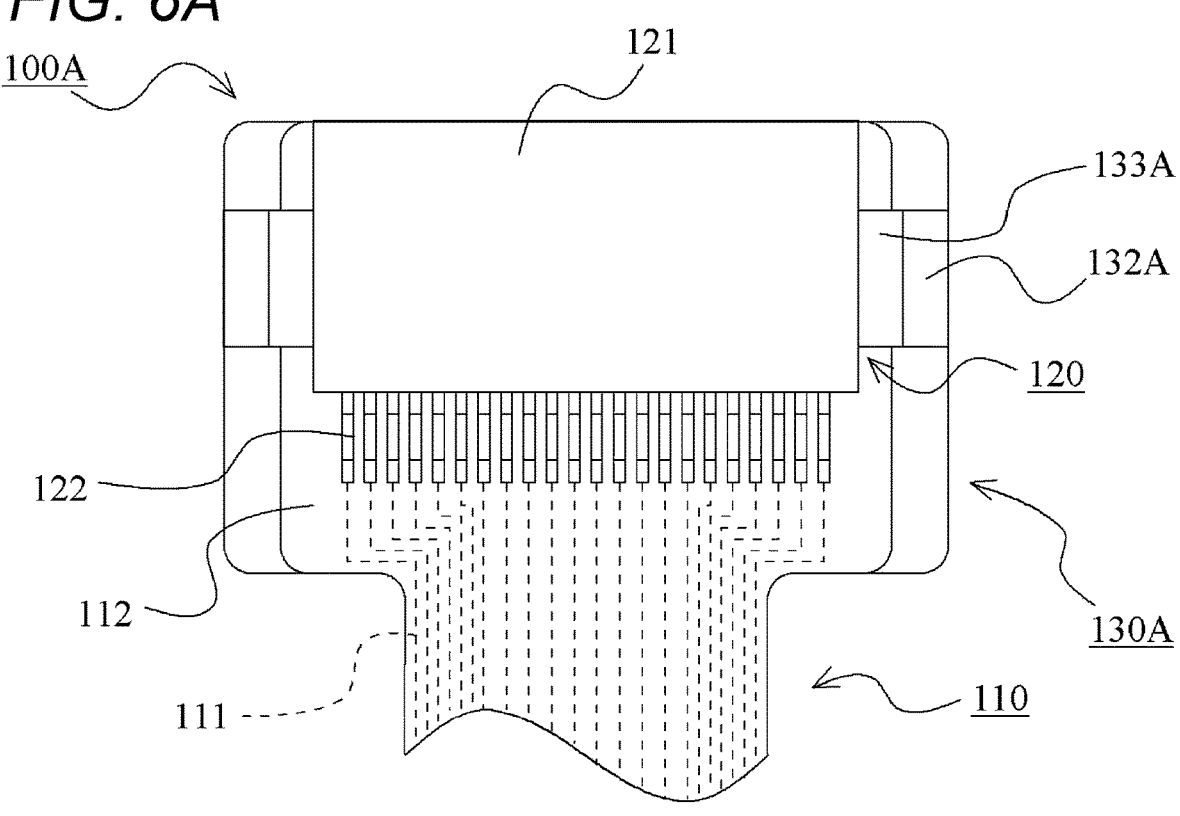
FIGS. 6A and 6B are schematic views of the configuration of a connector-equipped flexible printed circuit board according to a second embodiment of the present disclosure.
Figure 7:
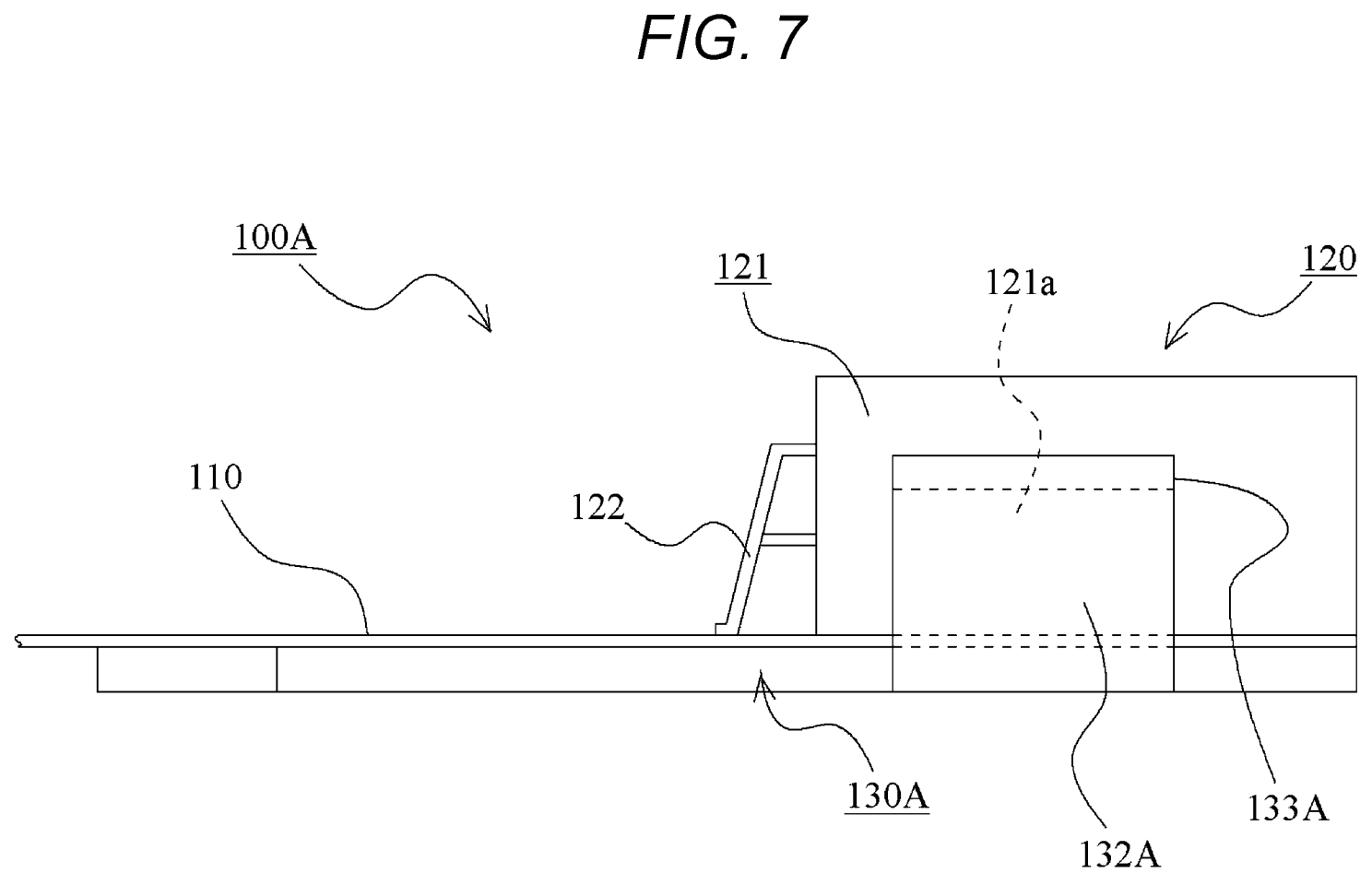
Figure 8:
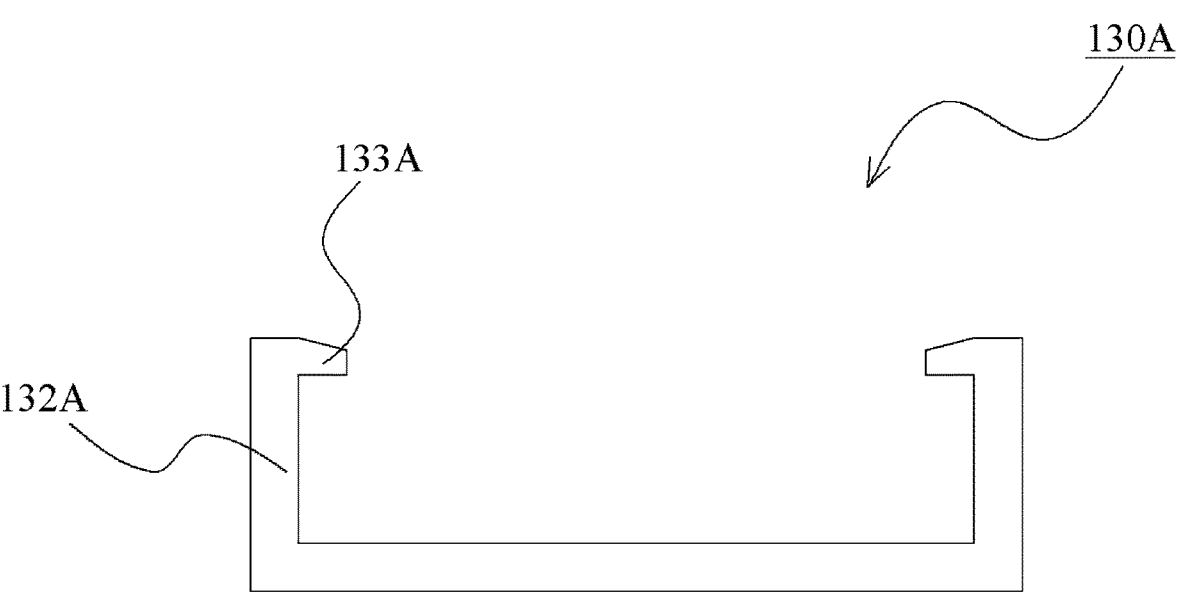
FIG. 8 is a front view of a reinforcing plate according to the second embodiment of the present disclosure.

A connector-equipped flexible printed circuit board (hereinafter referred to as a connector-equipped FPC 100A) according to the second embodiment of the present disclosure will be described with reference to FIGS. 6A to 8. FIGS. 6A, 6B, and 7 are schematic views of the configuration of the connector-equipped FPC 100A according to the second embodiment of the present disclosure. Note that FIG. 6A is a plan view showing the vicinity of a connector of the connector-equipped FPC 100A. FIG. 6B is a back view showing the vicinity of the connector of the connector-equipped FPC 100A. FIG. 7 is a side view showing the vicinity of the connector of the connector-equipped FPC 100A. FIG. 8 is a front view of a reinforcing plate according to the second embodiment of the present disclosure.

The connector-equipped FPC 100A includes a flexible printed circuit board 110 (hereinafter referred to as an FPC 110), a connector 120 joined to the FPC 110, and a reinforcing plate 130A. The reinforcing plate 130A is fixed to the surface of the FPC 110 opposite to the portion joined to the connector 120. The reinforcing plate 130A is mainly made of a material such as resin or metal.

The FPC 110 and the connector 120 are as described in the first embodiment, and therefore, description thereof will be omitted. Also in the present embodiment, the connector-equipped FPC 100A includes a stopper structure that restricts movement of the connector 120 in a direction apart from the FPC 110 in addition to joint between lines 111 and terminals 122 and joint protrusions 123.

The stopper structure according to the present embodiment will be described. The reinforcing plate 130A according to the present embodiment is different from the configuration of the reinforcing plate 130 in the first embodiment in that the reinforcing plate 130A includes a pair of side plate portions 132A and engagement claws 133A which are engagement portions each provided at the tip ends of the pair of side plate portions 132A. The pair of side plate portions 132A is configured to extent along the side wall surfaces of the connector 120 (more specifically a housing 121 of the connector 120). The pair of engagement claws 133A is configured to engage with the side wall surfaces of the connector 120. Note that in the present embodiment, the pair of engagement claws 133A is configured to engage with protrusion holding portions 121_a_ of the housing 121. A configuration in which the engagement claws 133A engage with the protrusion holding portions 121_a_ is described herein. On this point, for example, a configuration in which grooves or holes are formed in the housing 121 and the engagement claws 133A engage with these grooves or holes may be employed. As described above, the stopper structure according to the present embodiment is configured such that the engagement claws 133A provided at the reinforcing plate 130A engage with the side wall surfaces of the connector 120.

<Advantages of Connector-Equipped FPC 100A according to Present Embodiment>

The connector-equipped FPC 100A according to the present embodiment employs the configuration including the reinforcing plate 130A configured as described above. With this configuration, separation of the connector 120 from the FPC 110 can be reduced. Since the connector-equipped FPC 100A includes the stopper structure as described above, separation of the connector 120 from the FPC 110 can be reduced even when vibration or impact acts on the connector-equipped FPC 100A. Thus, damage of the vicinity of the portion of the FPC 110 joined to the connector 120 can be reduced.

Third Embodiment

FIGS. 9A to 11C show a third embodiment of the present disclosure. The present embodiment describes a configuration further including a reinforcing support member in addition to the configuration of the second embodiment. Other configurations and features are the same as those of the second embodiment. Thus, the same reference numerals are used to represent the same components, and description thereof will be omitted as necessary.

Figures 9A, 9B:
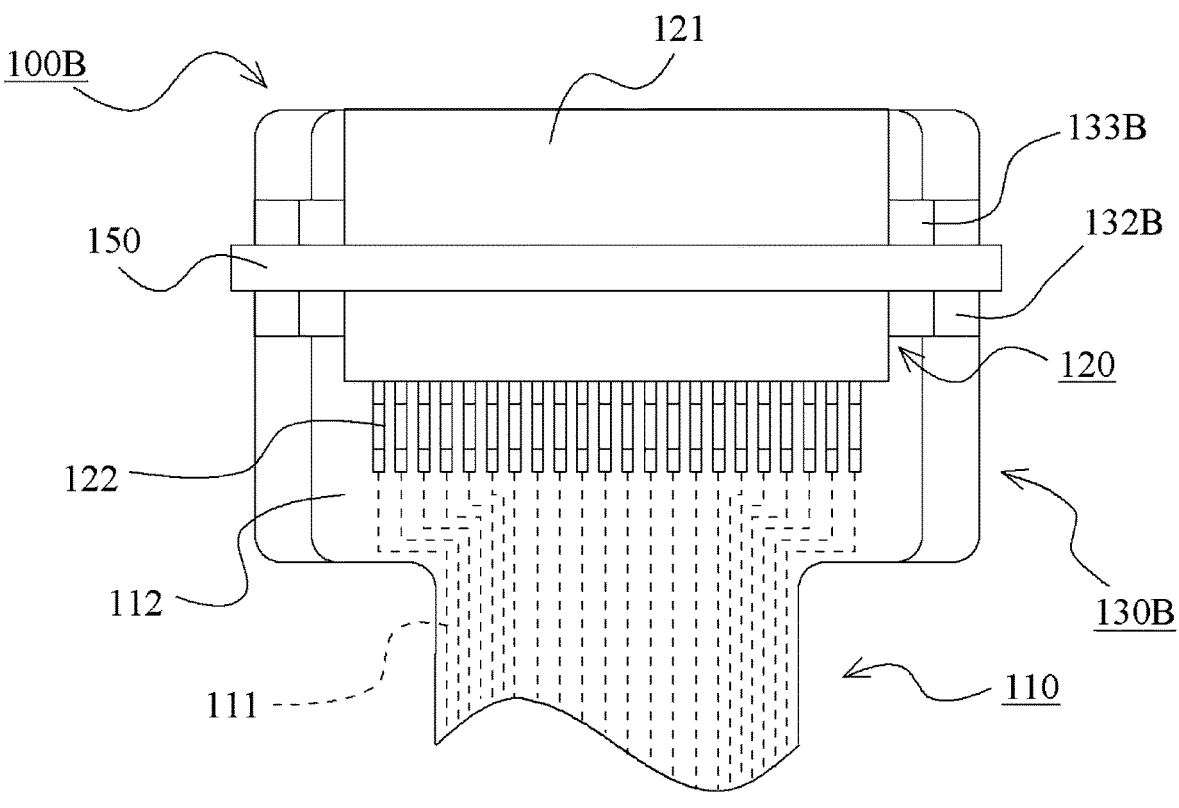
FIGS. 9A and 9B are schematic views of the configuration of a connector-equipped flexible printed circuit board according to a third embodiment of the present disclosure.
Figure 10:
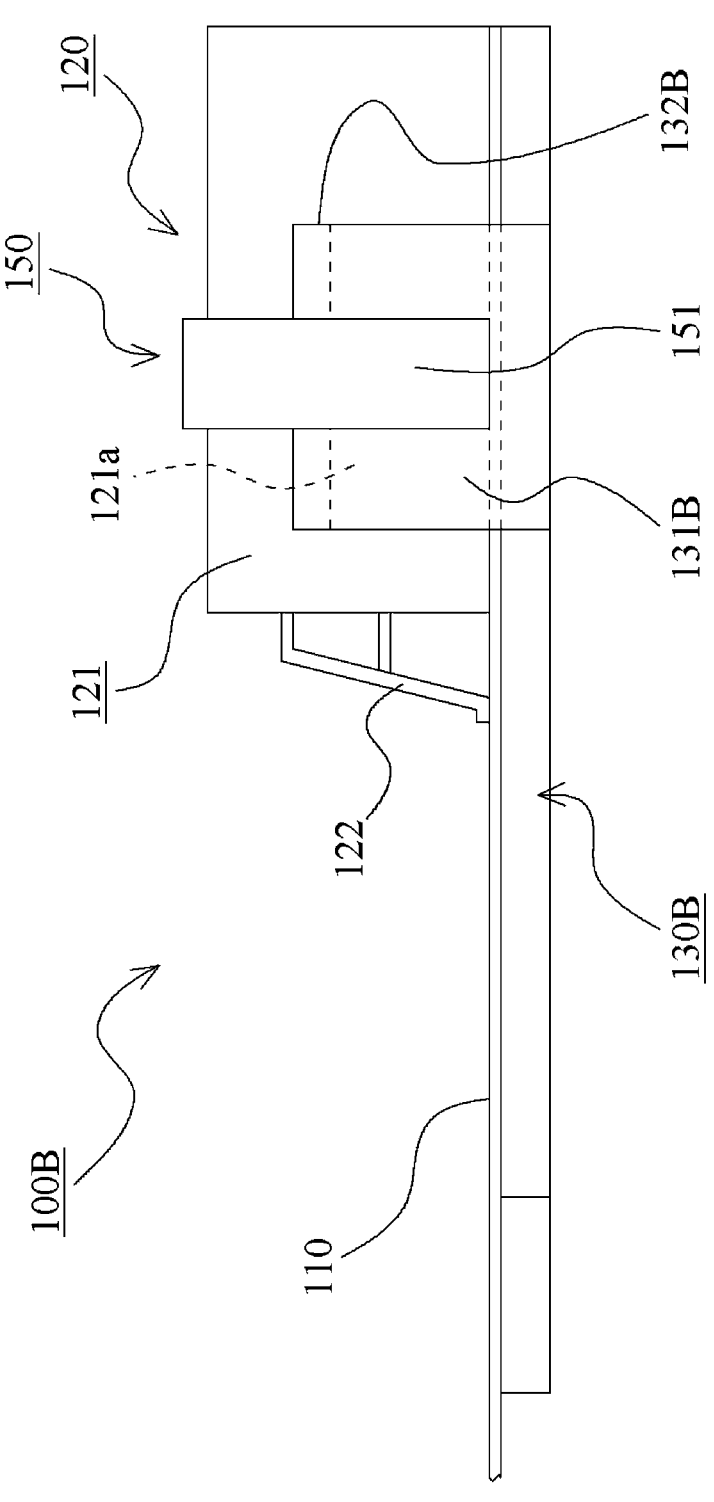
FIG. 10 is a schematic view of the configuration of the connector-equipped flexible printed circuit board according to the third embodiment of the present disclosure.
Figure 11A:
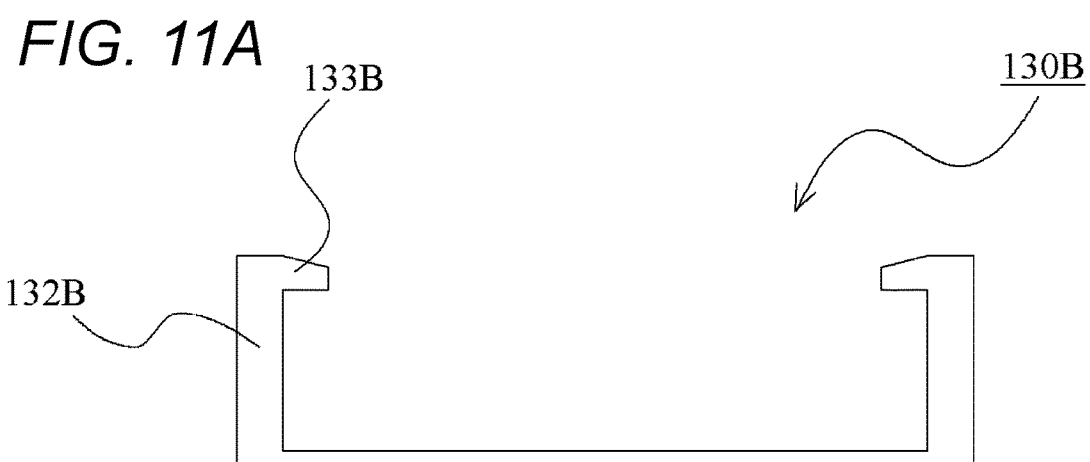
FIGS. 11A to 11C are schematic views of the configuration of a main portion of the connector-equipped flexible printed circuit board according to the third embodiment of the present disclosure.
Figure 11B:
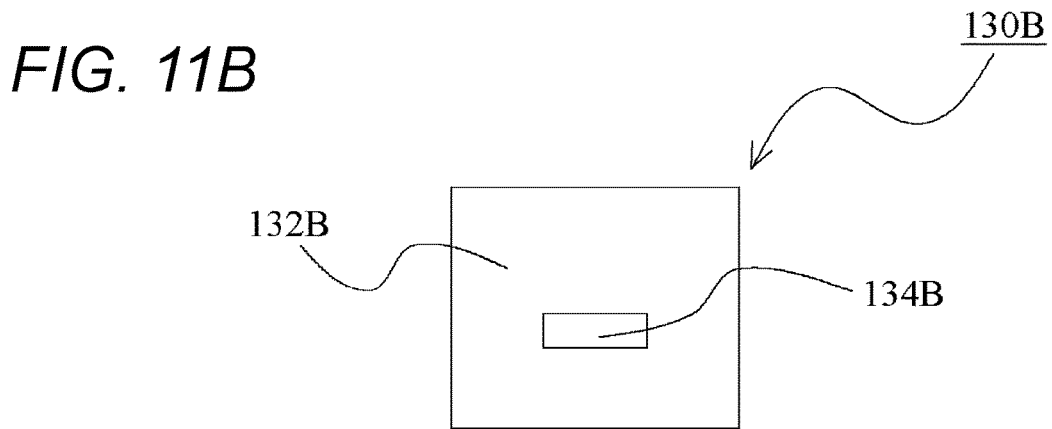
Figure 11C:
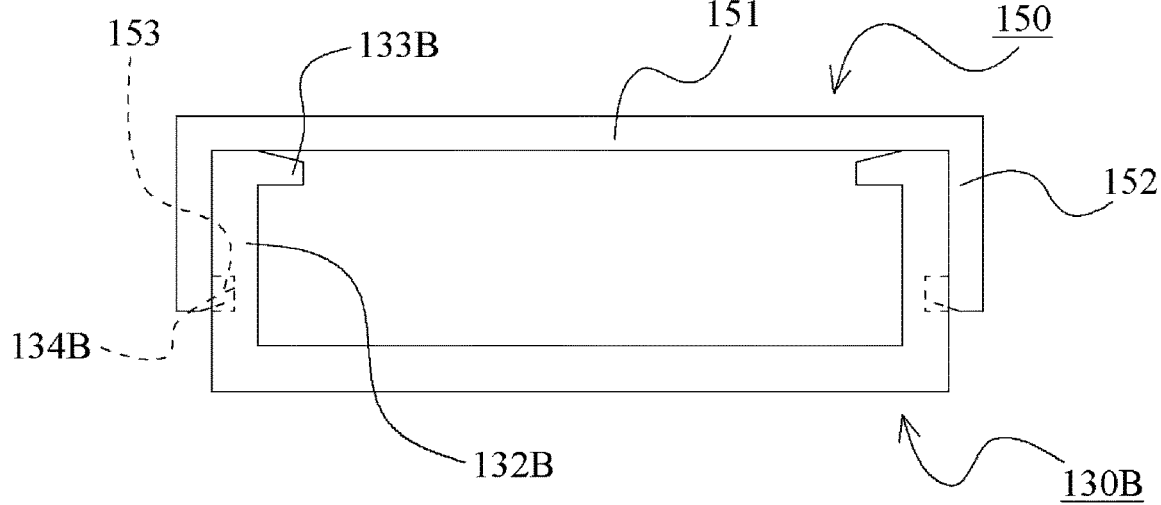

A connector-equipped flexible printed circuit board (hereinafter referred to as a connector-equipped FPC 100B) according to the third embodiment of the present disclosure will be described with reference to FIGS. 9A to 11C. FIGS. 9A, 9B, and 10 are schematic views of the configuration of the connector-equipped FPC 100B according to the third embodiment of the present disclosure. Note that FIG. 9A is a plan view showing the vicinity of a connector of the connector-equipped FPC 100B. FIG. 9B is a back view showing the vicinity of the connector of the connector-equipped FPC 100B. FIG. 10 is a side view showing the vicinity of the connector of the connector-equipped FPC 100B. FIGS. 11A to 11C are views for describing a reinforcing plate and the reinforcing support member according to the third embodiment of the present disclosure. FIG. 11A is a front view of the reinforcing plate. FIG. 11B is a side view of the reinforcing plate. FIG. 11C is a front view showing a state of the reinforcing support member being attached to the reinforcing plate. Note that components other than the reinforcing plate and the reinforcing support member are not shown in FIGS. 11A to 11C.

The connector-equipped FPC 100B includes a flexible printed circuit board 110 (hereinafter referred to as an FPC 110), a connector 120 joined to the FPC 110, and a reinforcing plate 130B. The reinforcing plate 130B is fixed to the surface of the FPC 110 opposite to the portion joined to the connector 120. The reinforcing plate 130B is mainly made of a material such as resin or metal.

The FPC 110 and the connector 120 are as described in the first embodiment, and therefore, description thereof will be omitted. Also in the present embodiment, the connector-equipped FPC 100B includes a stopper structure that restricts movement of the connector 120 in a direction apart from the FPC 110 in addition to joint between lines 111 and terminals 122 and joint protrusions 123.

The stopper structure according to the present embodiment will be described. The reinforcing plate 130B according to the present embodiment includes, as in the second embodiment, a pair of side plate portions 132B and engagement claws 133B which are engagement portions each provided at the tip ends of the pair of side plate portions 132B. The pair of side plate portions 132B is configured to extent along the side wall surfaces of the connector 120 (more specifically a housing 121 of the connector 120). The pair of engagement claws 133B is configured to engage with the side wall surfaces of the connector 120. Note that in the present embodiment, the pair of engagement claws 133B is configured to engage with protrusion holding portions 121a of the housing 121. A configuration in which the engagement claws 133B engage with the protrusion holding portions 121a is described herein. On this point, for example, a configuration in which grooves or holes are formed in the housing 121 and the engagement claws 133B engage with these grooves or holes may be employed.

Moreover, the stopper structure according to the present embodiment is different from the stopper structure of the second embodiment in that the stopper structure includes a reinforcing support member 150. The reinforcing support member 150 includes a support plate portion 151, a pair of reinforcing side plate portions 152 provided on both sides of the support plate portion 151, and engagement claws 153 which are reinforcing engagement portions each provided at the tip ends of the pair of reinforcing side plate portions 152. The support plate portion 151 is configured to contact the surface of the connector 120 (more specifically the housing 121 of the connector 120) opposite to the surface joined to the FPC 110. The pair of reinforcing side plate portions 152 is configured to extend from both sides of the support plate portion 151 along the pair of side plate portions 132B of the reinforcing plate 130B.

The reinforcing plate 130B according to the present embodiment is configured such that the side plate portions 132B are provided with grooves 134B with which the engagement claws 153 are to be engaged. Thus, the engagement claws 153 of the reinforcing support member 150 engage with the grooves 134B so that disengagement of the engagement claws 133B of the reinforcing plate 130B from the protrusion holding portions 121a can be reduced.

As described above, the stopper structure according to the present embodiment is configured such that the engagement claws 133B provided at the reinforcing plate 130B engage with the side wall surfaces of the connector 120 and the engagement claws 153 of the reinforcing support member 150 engage with the side plate portions 132B of the reinforcing plate 130B.

<Advantages of Connector-Equipped FPC 100B according to Present Embodiment>

The connector-equipped FPC 100B according to the present embodiment employs the configuration including the reinforcing plate 130B and the reinforcing support member 150 configured as described above. With this configuration, separation of the connector 120 from the FPC 110 can be further reduced. Since the connector-equipped FPC 100B includes the stopper structure as described above, separation of the connector 120 from the FPC 110 can be reduced even when vibration or impact acts on the connector-equipped FPC 100B. Thus, damage of the vicinity of the portion of the FPC 110 joined to the connector 120 can be reduced.

Fourth Embodiment

FIGS. 12A to 14 show a fourth embodiment of the present disclosure. The present embodiment describes a configuration having a different reinforcing support member in the configuration described in the third embodiment. Other configurations and features are the same as those of the third embodiment. Thus, the same reference numerals are used to represent the same components, and description thereof will be omitted as necessary.

Figures 12A, 12B:
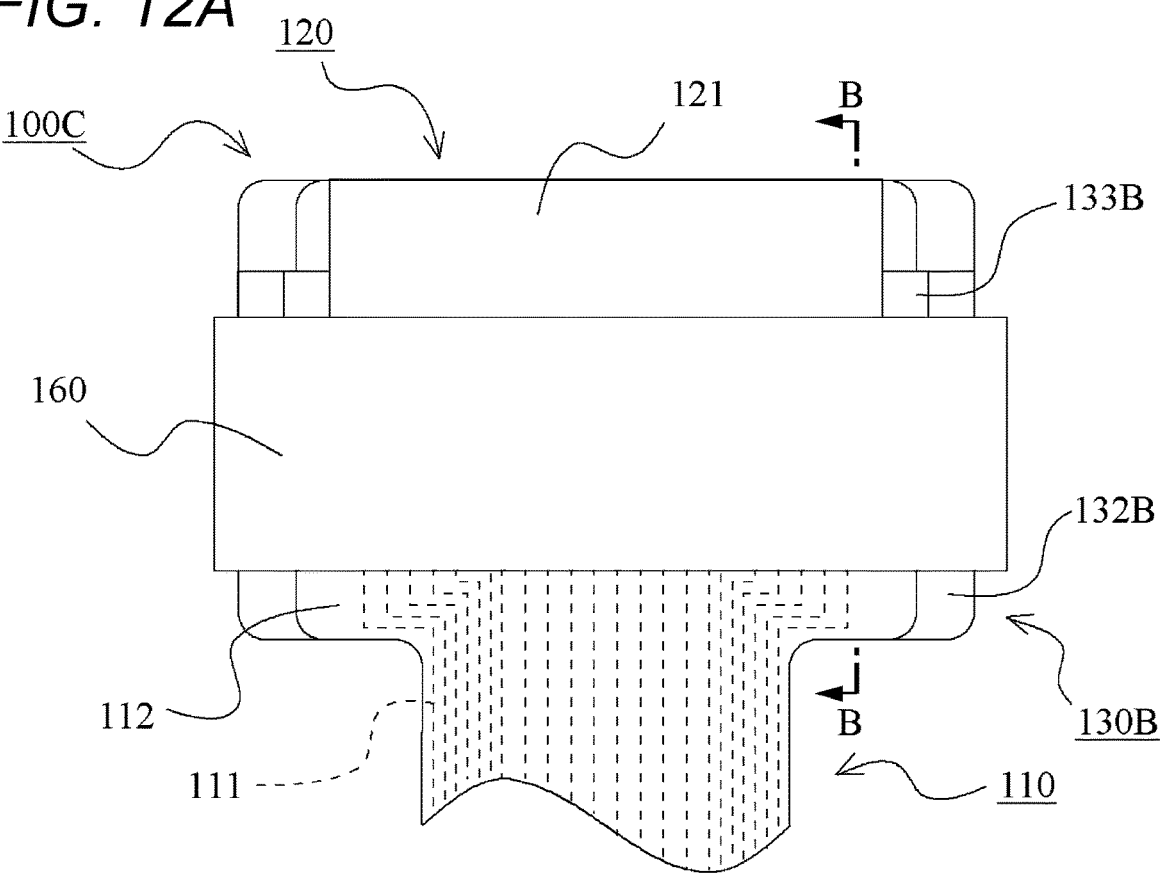
FIGS. 12A and 12B are schematic views of the configuration of a connector-equipped flexible printed circuit board according to a fourth embodiment of the present disclosure.
Figure 13:
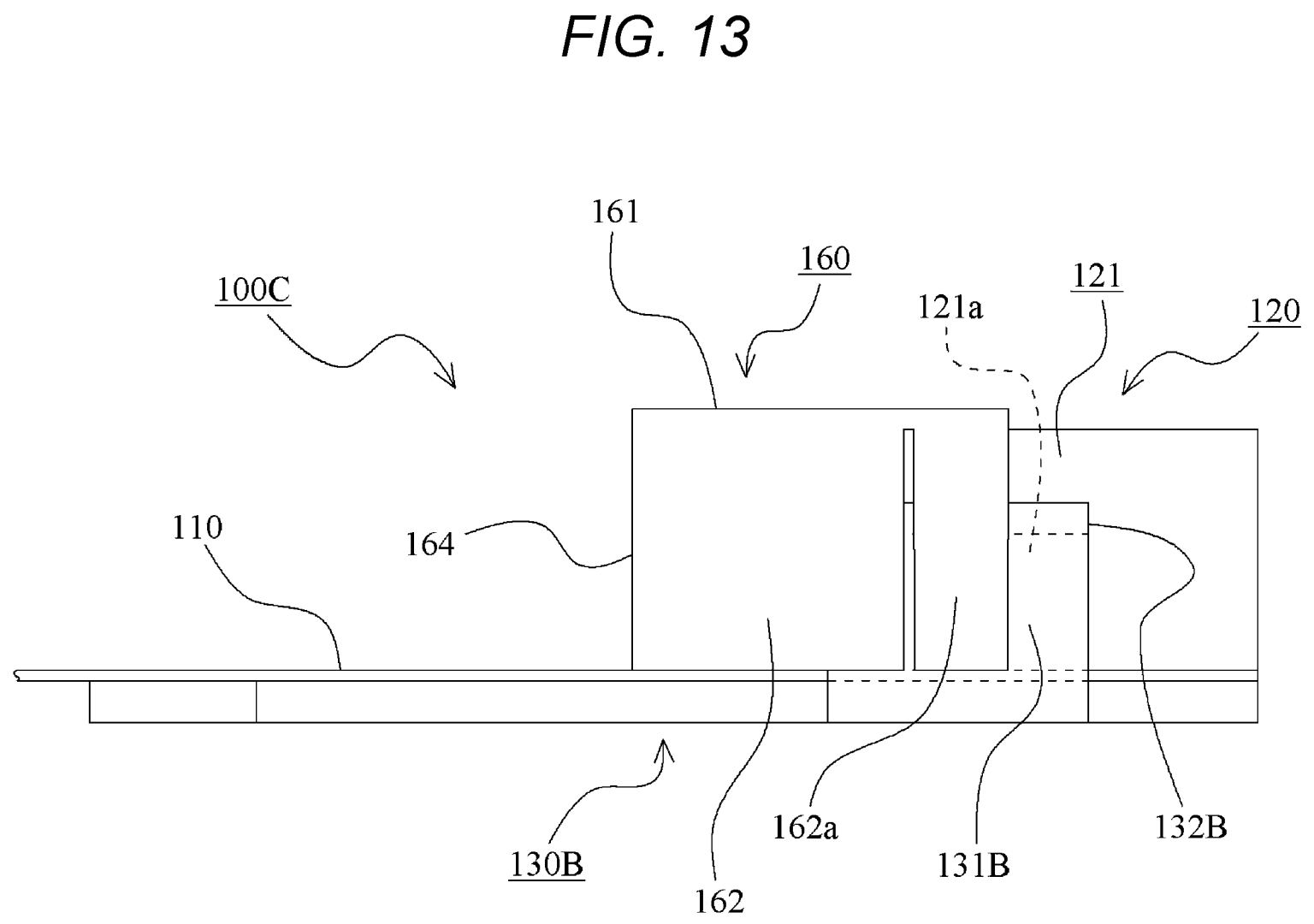
Figure 14:
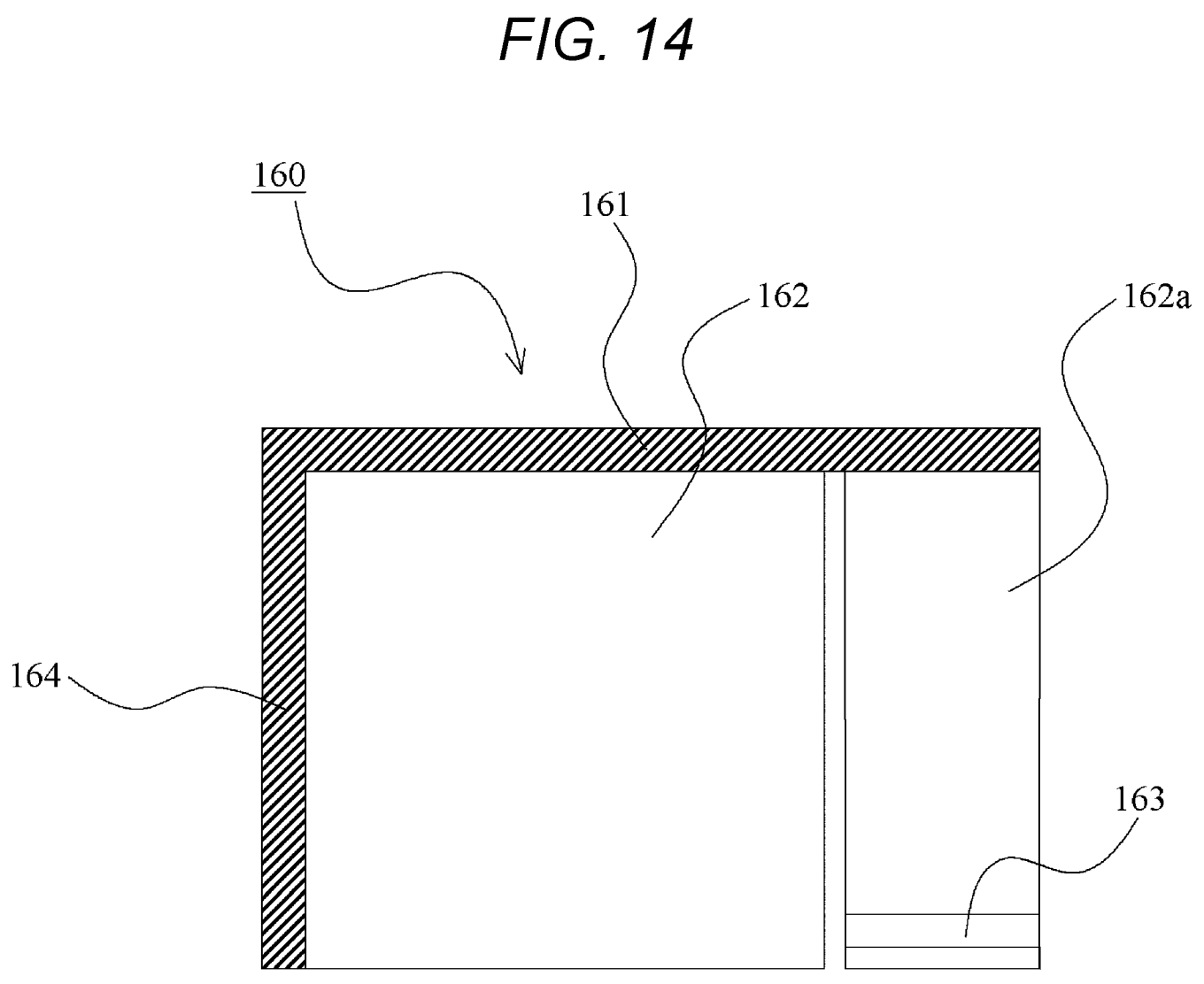

A connector-equipped flexible printed circuit board (hereinafter referred to as a connector-equipped FPC 100C) according to the fourth embodiment of the present disclosure will be described with reference to FIGS. 12A to 14. FIGS. 12A, 12B, and 13 are schematic views of the configuration of the connector-equipped FPC 100C according to the fourth embodiment of the present disclosure. Note that FIG. 12A is a plan view showing the vicinity of a connector of the connector-equipped FPC 100C. FIG. 12B is a back view showing the vicinity of the connector of the connector-equipped FPC 100C. FIG. 13 is a side view showing the vicinity of the connector of the connector-equipped FPC 100C. FIG. 14 is a schematic sectional view of the reinforcing support member according to the fourth embodiment of the present disclosure. Note that FIG. 14 is equivalent to a sectional view of the reinforcing support member along a BB line of FIG. 12A.

The connector-equipped FPC 100C includes a flexible printed circuit board 110 (hereinafter referred to as an FPC 110), a connector 120 joined to the FPC 110, and a reinforcing plate 130B. The reinforcing plate 130B is fixed to the surface of the FPC 110 opposite to the portion joined to the connector 120.

The FPC 110, the connector 120, and the reinforcing plate 130B are as described in the first and third embodiments, and therefore, description thereof will be omitted. Also in the present embodiment, the connector-equipped FPC 100C includes a stopper structure that restricts movement of the connector 120 in a direction apart from the FPC 110 in addition to joint between lines 111 and terminals 122 and joint protrusions 123.

The stopper structure according to the present embodiment will be described. In the stopper structure according to the present embodiment, the configuration of a reinforcing support member 160 is different from the reinforcing support member 150 of the third embodiment. The reinforcing support member 160 includes a support plate portion 161, a pair of first reinforcing side plate portions 162 and a pair of second reinforcing side plate portions 162a provided on both sides of the support plate portion 161, and engagement claws 163 which are reinforcing engagement portions each provided at the tip ends of the pair of second reinforcing side plate portions 162a. In the present embodiment, a third reinforcing side plate portion 164 is provided on one end side of the support plate portion 161 and the pair of first reinforcing side plate portions 162 with connected to these portions.

The support plate portion 161 is configured to contact the surface of the connector 120 (more specifically a housing 121 of the connector 120) opposite to the surface joined to the FPC 110. The second reinforcing side plate portions 162a are configured to extend from both sides of the support plate portion 161 along the pair of side plate portions 132B of the reinforcing plate 130B. Note that the pair of first reinforcing side plate portions 162 and the pair of second reinforcing side plate portions 162a are separated from each other. Thus, the pair of second reinforcing side plate portions 162a has flexibility. With this configuration, the engagement claws 163 of the reinforcing support member 160 engage with grooves 134B so that disengagement of engagement claws 133B of the reinforcing plate 130B from protrusion holding portions 121a can be reduced, as in the third embodiment. On the above-described point, the stopper structure according to the present embodiment has features and effects similar to those of the third embodiment.

Further, in the present embodiment, a cover function of covering the terminals 122 and exposed portions of the lines 111 on the FPC 110 with the support plate portion 161, the pair of first reinforcing side plate portions 162, and the third reinforcing side plate portion 164 is fulfilled.

<Advantages of Connector-Equipped FPC 100C according to Present Embodiment>

The connector-equipped FPC 100C according to the present embodiment provides effects similar to those of the third embodiment. Moreover, in the present embodiment, the terminals 122 and the exposed portions of the lines 111 on the FPC 110 are covered with the reinforcing support member 160. With this configuration, a probability of, e.g., a hand or a finger accidentally contacting the terminals 122 or the lines 111 can be reduced. Moreover, a probability of water droplets adhering to the terminals 122 or the lines 111 and causing short-circuit can be reduced.

Fifth Embodiment

FIGS. 15A, 15B, 16A, and 16B show a fifth embodiment of the present disclosure. The present embodiment describes a configuration having a different support member in the configuration of the first embodiment. Other configurations and features are the same as those of the first embodiment. Thus, the same reference numerals are used to represent the same components, and description thereof will be omitted as necessary.

Figure 15A:
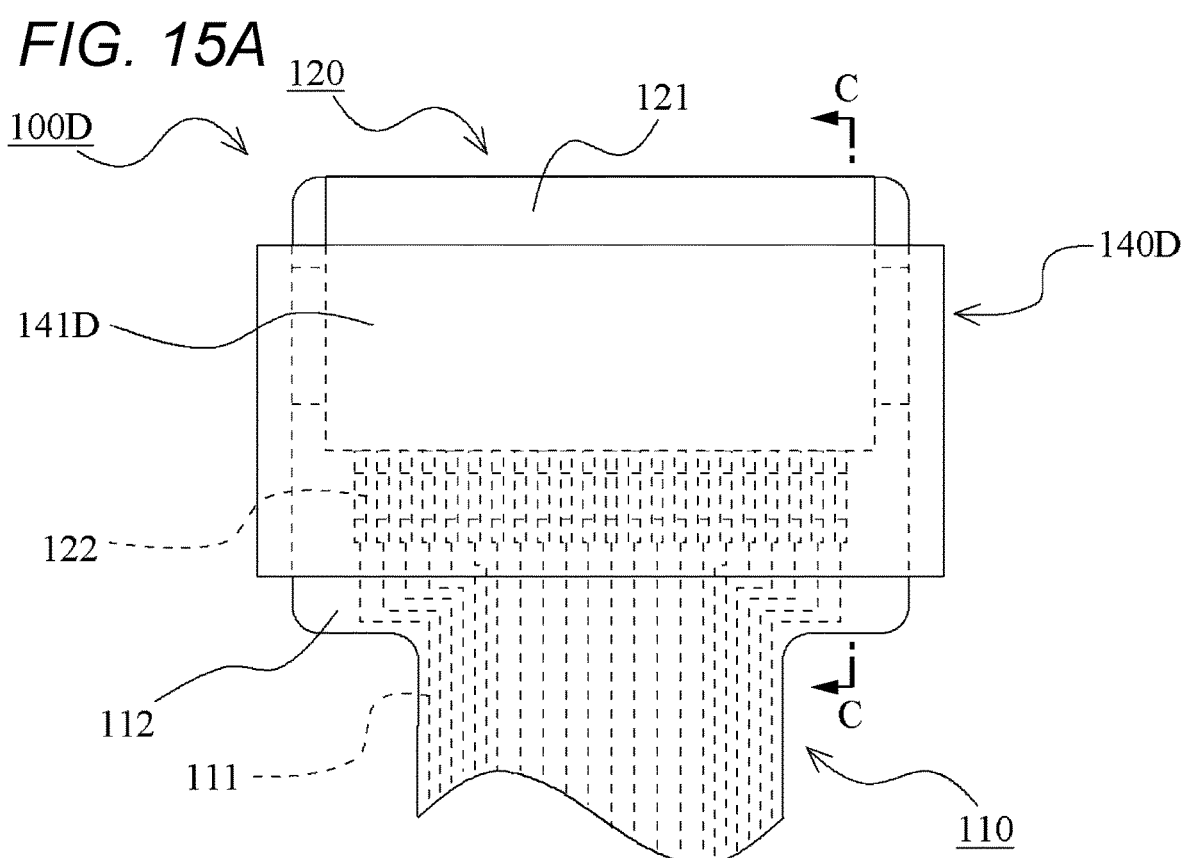
FIGS. 15A and 15B are schematic views of the configuration of a connector-equipped flexible printed circuit board according to a fifth embodiment of the present disclosure.
Figure 15B:
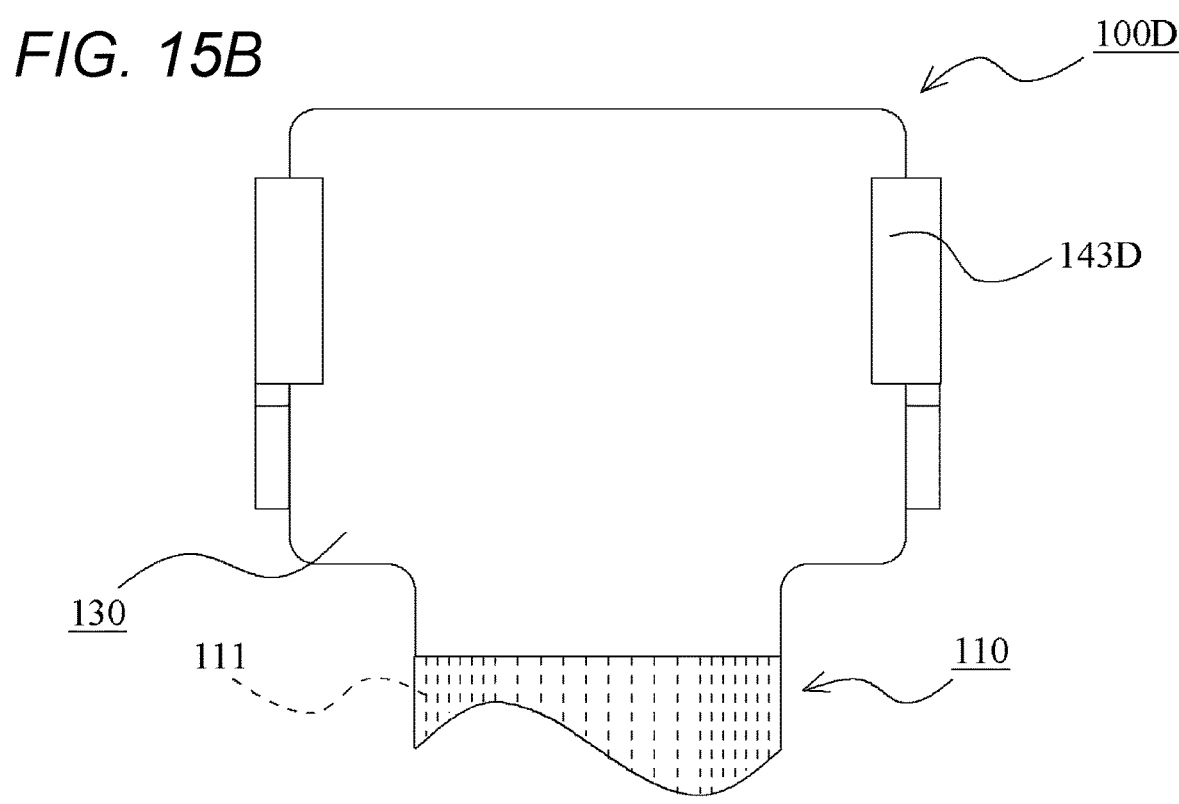
Figure 16A:
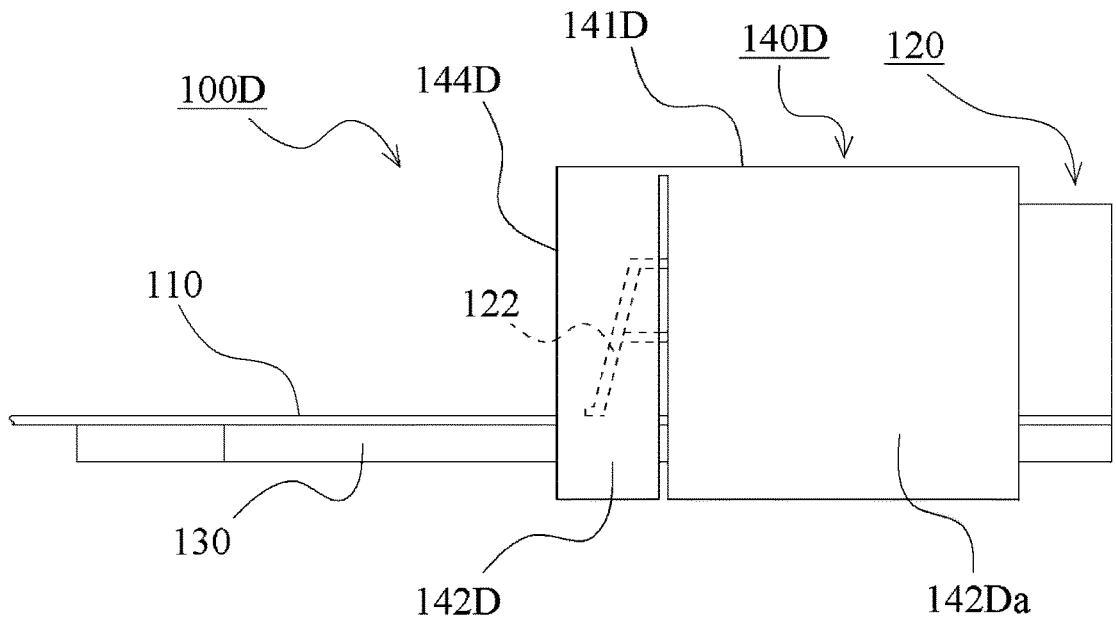
FIGS. 16A and 16B are schematic views of the configuration of the connector-equipped flexible printed circuit board according to the fifth embodiment of the present disclosure.
Figure 16B:
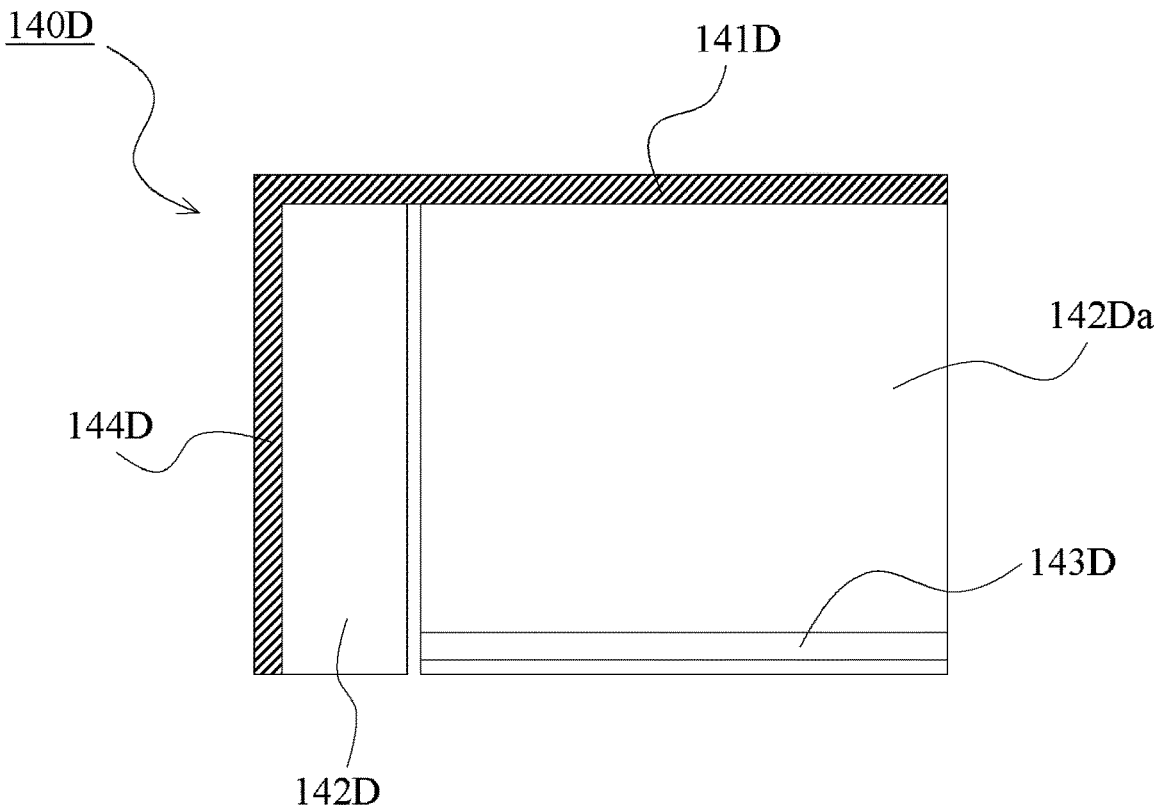
Figure 17:
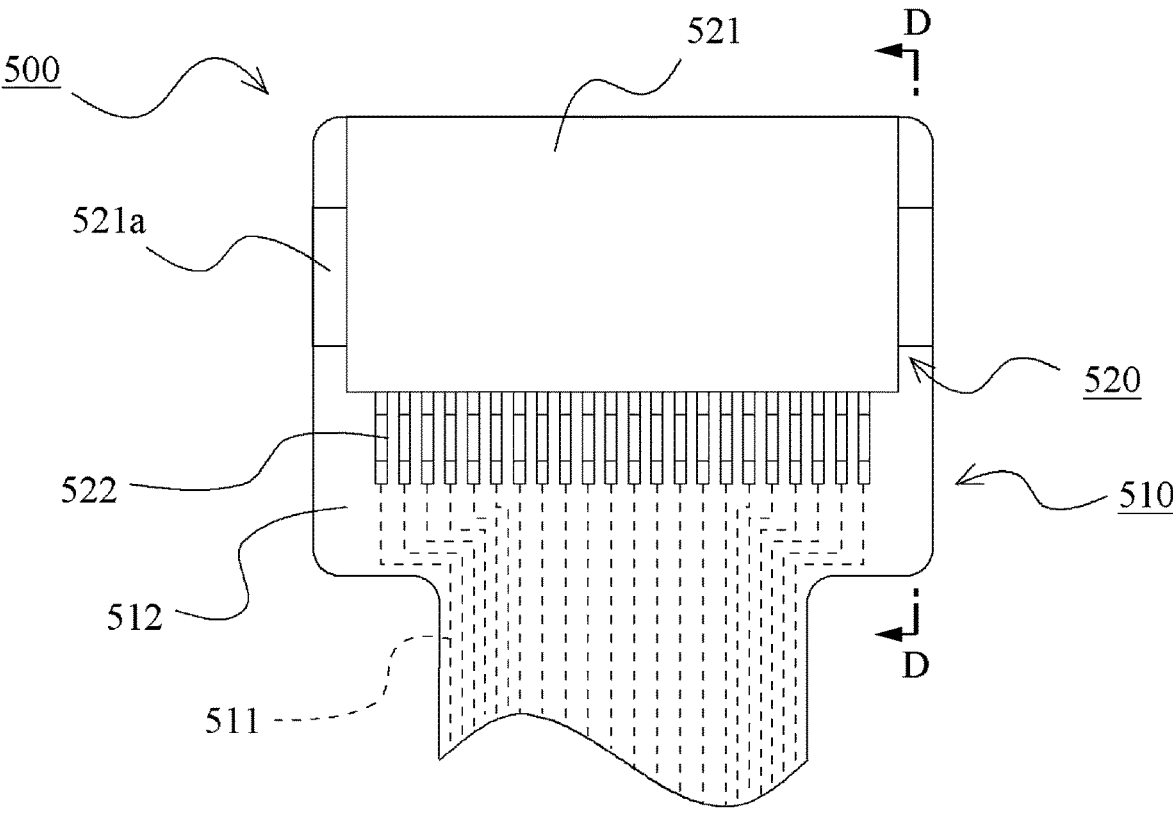
FIG. 17 is a schematic view of the configuration of a connector-equipped flexible printed circuit board according to the prior art.
Figures 18A, 18B:
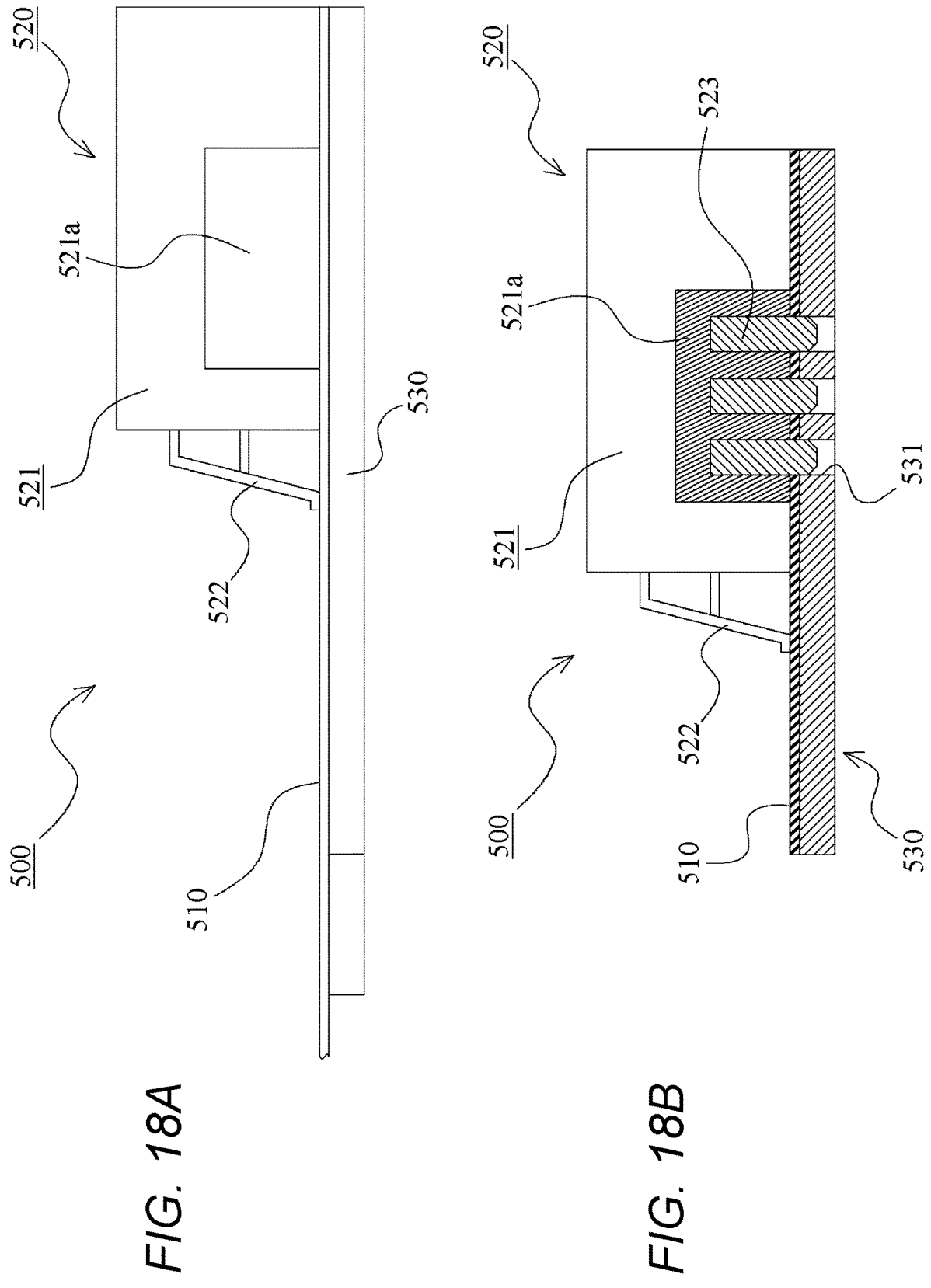
FIGS. 18A and 18B are schematic views of the configuration of the connector-equipped flexible printed circuit board according to the prior art.

A connector-equipped flexible printed circuit board (hereinafter referred to as a connector-equipped FPC 100D) according to the fifth embodiment of the present disclosure will be described with reference to FIGS. 15A, 15B, 16A, and 16B. FIGS. 15A, 15B, 16A, and 16B are schematic views of the configuration of the connector-equipped FPC 100D according to the fifth embodiment of the present disclosure. Note that FIG. 15A is a plan view showing the vicinity of a connector of the connector-equipped FPC 100D. FIG. 15B is a back view showing the vicinity of the connector of the connector-equipped FPC 100D. FIG. 16A is a side view showing the vicinity of the connector of the connector-equipped FPC 100D. FIG. 16B is a schematic sectional view of the support member according to the fifth embodiment of the present disclosure. Note that FIG. 16B is equivalent to a sectional view of the support member along a CC line of FIG. 15A.

The connector-equipped FPC 100D includes a flexible printed circuit board 110 (hereinafter referred to as an FPC 110), a connector 120 joined to the FPC 110, and a reinforcing plate 130. The reinforcing plate 130 is fixed to the surface of the FPC 110 opposite to the portion joined to the connector 120.

The FPC 110, the connector 120, and the reinforcing plate 130 are as described in the first embodiment, and therefore, description thereof will be omitted. Also in the present embodiment, the connector-equipped FPC 100D includes a stopper structure that restricts movement of the connector 120 in a direction apart from the FPC 110 in addition to joint between lines 111 and terminals 122 and joint protrusions 123.

The stopper structure according to the present embodiment will be described. In the stopper structure according to the present embodiment, the configuration of a support member 140D is different from the support member 140 of the first embodiment. The support member 140D includes a support plate portion 141D, a pair of first side plate portions 142D and a pair of second side plate portions 142Da provided on both sides of the support plate portion 141D, and engagement claws 143D which are engagement portions each provided at the tip ends of the pair of second side plate portions 142Da. In the present embodiment, a third side plate portion 144D is provided on one end side of the support plate portion 141D and the pair of first side plate portions 142D with connected to these portions.

The support plate portion 141D is configured to contact the surface of the connector 120 (more specifically a housing 121 of the connector 120) opposite to the surface joined to the FPC 110. The second side plate portions 142Da are configured to extend from both sides of the support plate portion 141D toward the reinforcing plate 130. Note that the pair of first side plate portions 142D and the pair of second side plate portions 142Da are separated from each other. Thus, the pair of second side plate portions 142Da has flexibility. With this configuration, the engagement claws 143D of the support member 140D engage with the reinforcing plate 130 as in the first embodiment. On the above-described point, the stopper structure according to the present embodiment has features and effects similar to those of the first embodiment.

Further, in the present embodiment, a cover function of covering the terminals 122 and exposed portions of the lines 111 on the FPC 110 with the support plate portion 141D, the pair of first side plate portions 142D, and the third side plate portion 144D is fulfilled. Note that in FIG. 15A, the connector 120 inside the support member 140 is shown in a see-through state and is indicated by a dashed line. In FIGS. 16A and 16B, the terminals 122 are shown in a see-through state and are indicated by dashed lines.

<Advantages of Connector-Equipped FPC 100D according to Present Embodiment>

The connector-equipped FPC 100D according to the present embodiment provides effects similar to those of the first embodiment. Moreover, in the present embodiment, the terminals 122 and the exposed portions of the lines 111 on the FPC 110 are covered with the support member 140D. With this configuration, a probability of, e.g., a hand or a finger accidentally contacting the terminals 122 or the lines 111 can be reduced. Moreover, a probability of water droplets adhering to the terminals 122 or the lines 111 and causing short-circuit can be reduced.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A connector-equipped flexible printed circuit board comprising:
   a flexible printed circuit board;
   a connector having a terminal to be connected to a line provided for the flexible printed circuit board and joined to the flexible printed circuit board; and
   a reinforcing plate fixed to a surface of the flexible printed circuit board opposite to a portion joined to the connector, wherein the connector has a joint protrusion configured to penetrate the flexible printed circuit board,
a stopper structure that restricts movement of the connector in a direction apart from the flexible printed circuit board is provided in addition to joint between the line and the terminal and the joint protrusion,
the stopper structure includes a support member, and
the support member has
   a support plate portion contacting a surface of the connector opposite to a surface joined to the flexible printed circuit board,
   a pair of side plate portions extending from both sides of the support plate portion toward the reinforcing plate, and
   engagement portions each provided at tip ends of the pair of side plate portions to engage with the reinforcing plate.

2. The connector-equipped flexible printed circuit board according to claim 1, wherein
   the support member includes a cover that covers the terminal and an exposed portion of the line on the flexible printed circuit board.

3. A connector-equipped flexible printed circuit board comprising:
   a flexible printed circuit board;
   a connector having a terminal to be connected to a line provided for the flexible printed circuit board and joined to the flexible printed circuit board; and
   a reinforcing plate fixed to a surface of the flexible printed circuit board opposite to a portion joined to the connector,
   wherein the connector has a joint protrusion configured to penetrate the flexible printed circuit board,
   a stopper structure that restricts movement of the connector in a direction apart from the flexible printed circuit board is provided in addition to joint between the line and the terminal and the joint protrusion,
   the stopper structure includes
      a pair of side plate portions extending along side wall surfaces of the connector, and
      engagement portions each provided at tip ends of the pair of side plate portions to engage with the side wall surfaces of the connector, and
   the pair of side plate portions and the engagement portions are included in the reinforcing plate.

4. The connector-equipped flexible printed circuit board according to claim 3, wherein
   the stopper structure includes a reinforcing support member, and
   the reinforcing support member has
   a support plate portion contacting a surface of the connector opposite to a surface joined to the flexible printed circuit board,
   a pair of reinforcing side plate portions extending from both sides of the support plate portion along the pair of side plate portions of the reinforcing plate, and
   reinforcing engagement portions each provided at tip ends of the pair of reinforcing side plate portions to engage with the pair of side plate portions.

5. The connector-equipped flexible printed circuit board according to claim 4, wherein
   the reinforcing support member includes a cover that covers the terminal and an exposed portion of the line on the flexible printed circuit board.

* * * * *